United States Patent [19]

Pech

[11] 4,303,890

[45] Dec. 1, 1981

[54] CIRCUIT ARRANGEMENT FOR TRANSFERRING A SIGNAL

[75] Inventor: Eckart Pech, Ammersbek, Fed. Rep. of Germany

[73] Assignee: U.S. Philips Corporation, New York, N.Y.

[21] Appl. No.: 91,297

[22] Filed: Nov. 5, 1979

[30] Foreign Application Priority Data

Dec. 23, 1978 [DE] Fed. Rep. of Germany ....... 2855930

[51] Int. Cl.³ .............................................. H03F 3/04
[52] U.S. Cl. .................................... 330/257; 330/288
[58] Field of Search ............... 330/288, 257, 306, 302; 323/4

[56] References Cited

U.S. PATENT DOCUMENTS 3,986,152 10/1976 Howell .......................... 330/288 X
4,166,971 9/1979 Schneider ...................... 330/288 X Primary Examiner—James B. Mullins
Assistant Examiner—Gene Wan
Attorney, Agent, or Firm—Thomas A. Briody; Robert T. Mayer; Steven R. Biren

[57] ABSTRACT

A circuit arrangement for transferring a signal from a first A.C. circuit point to a second A.C. circuit point includes a resonant circuit and a current mirror. The input of the current mirror is connected to the resonant circuit, while its common emitter terminal is connected to the first A.C. circuit point and its output is connected to the second A.C. circuit point. In this manner one side of the resonant circuit may be grounded, even though the resonant circuit is effectively inserted between the two A.C. circuit points which are isolated from ground.

4 Claims, 2 Drawing Figures

CIRCUIT ARRANGEMENT FOR TRANSFERRING A SIGNAL

BACKGROUND OF THE INVENTION

The invention relates to a circuit arrangement for transferring a signal from a first circuit point to a second circuit point, specifically an amplifier input, via an impedance, specifically a resonance element.

The first circuit point may be a voltage source with low internal resistance, for example an output of an emitter-follower stage, from which the signal is transferred to the second circuit point via the impedance which is included in the series branch. Thus, the two ends of the impedance carry a voltage relative to the reference potential.

SUMMARY OF THE INVENTION

It is the object of the invention to realize the desired transfer, including the impedance in a parallel branch, in such a way that one pole thereof is connected to a point of reference potential, for example ground or a battery voltage.

This object is achieved, in accordance with the invention, if common electrode of a current mirror circuit, whose control branch is energized from a point of reference potential via a current source and whose controlled branch is connected to the second circuit point, is connected to the first circuit point, the impedance being connected in parallel with the current source.

Such a circuit arrangement may be effective for constructing such an impedance. A special advantage is obtained if the relevant impedance is to be accommodated outside an integrated circuit. Whereas in the known arrangement two separate leads to the integrated circuit are necessary, an arrangement in accordance with the invention will enable the use of a power-supply connection, which is available anyway, such as the ground connection.

BRIEF DESCRIPTION OF THE DRAWING

The invention will be described in more detail by way of example with reference to the drawing, in which.

DETAILED DESCRIPTION

Figure 1:
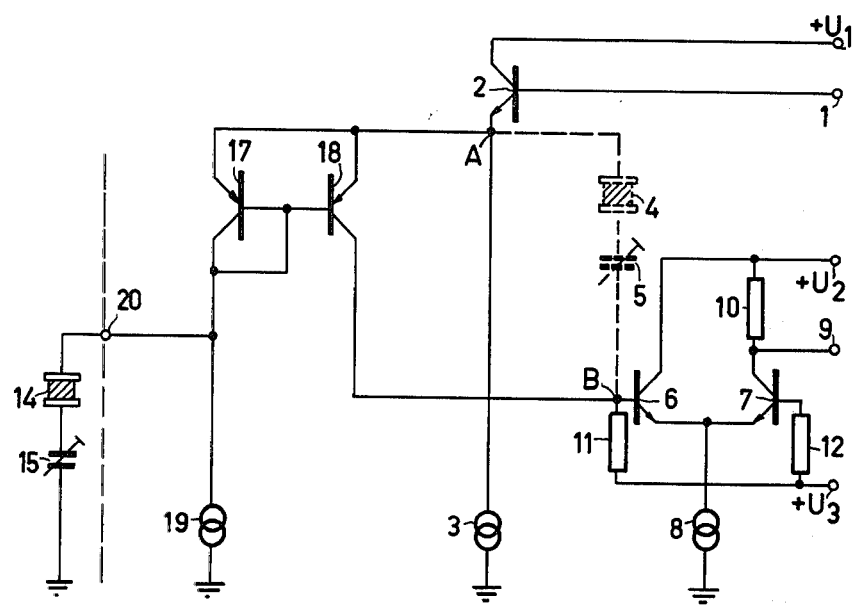
FIGS. 1 and 2 show two embodiments of the invention.

In FIG. 1 a signal is applied from an input terminal 1 to the base of an npn-transistor 2, whose collector is connected to a supply voltage $+U_1$ and whose emitter is connected to ground and thus to the other terminal of the power-supply source via a current source 3, such as an ohmic resistance. The input signal appears at a first A.C. circuit point A, which is connected to the emitter of the transistor 2, which signal in a known filter or oscillator circuit is applied to a second A.C. circuit point B via a resonator crystal 4 and variable capacitor 5 which is connected in series therewith, which second point is connected to the base of an npn-transistor 6. The emitter of this transistor 6 is connected to the emitter of a further npn-transistor 7 and via a current source 8 to ground. The collector of the transistor 6 is connected to a supply voltage $+U_2$, whose negative terminal is connected to ground; the collector of the transistor 7 is connected to said supply source via a load resistor 10 and, moreover, to the output terminal 9.

Furthermore, the bases of the transistors 6 and 7 are connected to a bias voltage source $+U_3$ via resistors 11 and 12.

For the signals applied to the terminal 1 the prior art elements 4 and 5 operate as series resonant circuits, which filter out oscillations of the relevant frequency and transfer these to the output terminal 9 via the differential amplifiers 6, 7.

The series impedance 4, 5 is at an a.c. potential at both ends. In accordance with the invention it is possible instead to connect one of the impedance ends to earth.

For this purpose, in accordance with the invention, the circuit point A is connected to the common emitter terminal of a current mirror circuit. This circuit comprises two pnp-transistors 17 and 18, whose emitters are jointly connected to the first A.C. circuit point A and whose bases together with the collector electrode of transistor 17 are connected to ground via a current source 19. The current mirror circuit with transistors 17 and 18 is controlled at its control terminal at the collector of transistor 17 by the current source 19 in such a way that on the controlled terminal, at the collector of the transistor 18, a current appears which is equal to that applied to the second A.C. circuit point B at the input of the differential amplifier 6, 7. The filter impedance, comprising the series connection of a resonator crystal 14 and a capacitor 15, which may be variable, is included between ground and the collector of transistor 17 via a terminal 20 in such a way that it is in parallel with the current source 19.

When a signal is applied to the first A.C. circuit point A from transistor 2, it will appear on the common terminal (the emitters) of the current mirror, comprising the transistors 17 and 18 and, shifted by the emitter-base voltage of approximately 0.7 V, on the collector of the transistor 17, which transistor forms the control branch of the current mirror and functions as a diode because of the connection between the collector and the base. As the impedance of the current source 19 is very high, the impedance between the current mirror input at the collector of transistor 17 and earth is essentially determined by the series impedance of the circuit elements 14 and 15. For oscillations above its series resonance frequency this series impedance is high and has no effect. However, in the case of series resonance the impedance is low, so that an additional current is applied to the controlling transistor 17 of the current mirror 17, 18. This current then also appears in the collector circuit of the transistor 18, at the current mirror output or controlled branch, flows to the second circuit point B and drives the base input of the differential amplifier 6, 7 so that a correspondingly amplified output signal appears on the terminal 9. Thus, the same effect is obtained as in the circuit with the prior art resonant elements 4 and 5, but in the circuit in accordance with the invention the branch with the substituted resonant elements 14 and 15 is connected to ground on one side, so that only one external connection is required to the interior of an integrated circuit comprising the further circuit elements via the enclosure, shown dashed, at the terminal 20, since the ground; connection must be provided in any case.

In the circuit of FIG. 1 the current mirror is constituted by pnp-transistors 17 and 18. In an integrated circuit, which further comprises npn-transistors, such transistors generally have a substantially lower cut-off frequency.

Figure 2:
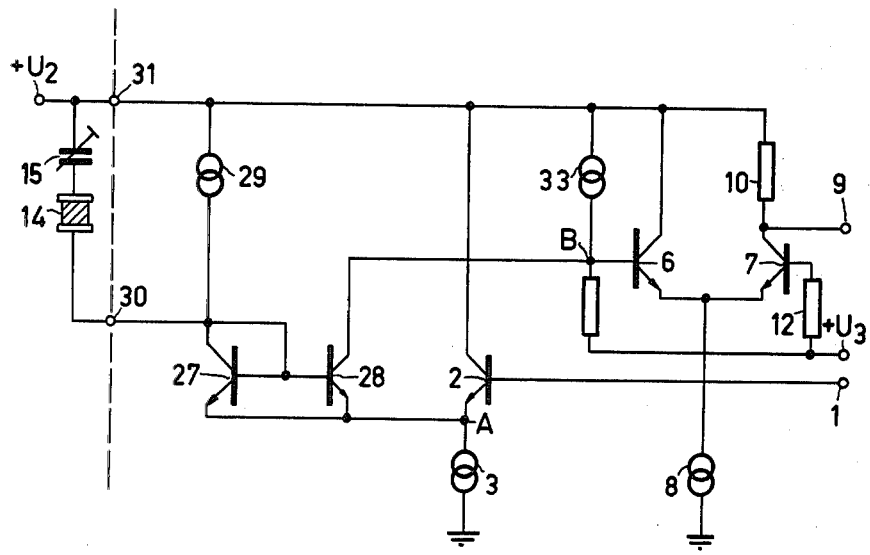

FIG. 2 shows a circuit arrangement in accordance with the invention, in which the required current mirror circuit is constituted by npn-transistors 27 and 28, whose interconnected emitters are connected to the output of the emitter-follower 2, which is driven from the input terminal 1. The current source 29 is included between the collector of transistor 27 and the power supply source $+U_2$, the impedance 14, 15, which behaves as a series resonant circuit, being connected in parallel therewith between terminals 30 and 31. The single additional external input is provided at terminal 30, while terminal 31, which is at A.C. ground potential, is externally available as it is the connection to the supply voltage $+U_2$.

The output current of the second current mirror transistor 28 is applied to the second circuit point B at the input of the differential amplifier 6, 7 which is included in a similar way as in FIG. 1. As the base direct current of the npn-transistor 6 and the collector direct current of current mirror transistor 28 are currents which, viewed from point B, flow in the same direction, it is necessary to apply a corresponding current from the supply voltage $+U_2$ via a current source 33.

The current sources 29 and 30 may be formed with pnp-transistors in the usual manner. However, as they need not transfer a signal current, but solely operate as an impedance, their frequency response will be less critical. Furthermore, one or more of the current sources may also be replaced by resistors.

What is claimed is:

1. A circuit arrangement for transferring a signal from a first A.C. circuit point to a second A.C. circuit point, which comprises:

means for providing an A.C. input signal to said first A.C. circuit point;

a resonant impedance circuit having first and second terminals, said first terminal being connected to an A.C. circuit ground point;

a current mirror circuit having a common terminal, a control terminal and a controlled terminal, said control terminal being connected to said second terminal of the resonant impedance circuit, said common terminal being connected to the first A.C. circuit point, and said controlled terminal being connected to said second A.C. circuit point;

a first D.C. current source connected from a selected D.C. potential to said current mirror control terminal; and means for obtaining an A.C. output signal from said second A.C. circuit point.

2. A circuit as claimed in claim 1, wherein said current mirror circuit comprises first and second bipolar transistors of like type, the emitter zones of said first and second transistors being connected together to form said common terminal, the base and collector zones of said first transistor and the base zone of said second transistor being connected together to form said control terminal, and the collector zone of said second transistor forming said controlled terminal.

3. A circuit arrangement as claimed in claim 2, wherein said means for providing an A.C. input signal to said first A.C. circuit point comprises a third bipolar transistor having a collector zone connected to a selected D.C. potential, a base zone which comprises an A.C. input terminal, and an emitter zone which is connected to said common terminal of the current mirror circuit, and said circuit arrangement further comprises a second D.C. current source connected from said common terminal to ground.

4. A circuit arrangement as in claim 3, wherein said means for obtaining an A.C. output signal from said second A.C. circuit point comprises a differential amplifier having a first differential input terminal connected to said second A.C. circuit point, a second differential input coupled to a selected D.C. potential, and an output terminal for obtaining said A.C. output signal.

* * * * *